US012581624B2

(12) United States Patent
Penney

(10) Patent No.: US 12,581,624 B2
(45) Date of Patent: Mar. 17, 2026

(54) VEHICLE CHARGING SYSTEM AND METHOD, WITH POWER CONVERTERS DIRECTLY COUPLED TO LIQUID COOLED COLD PLATE

(71) Applicant: Ford Global Technologies, LLC, Dearborn, MI (US)

(72) Inventor: John Penney, Livonia, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 378 days.

(21) Appl. No.: 18/153,853

(22) Filed: Jan. 12, 2023

(65) Prior Publication Data
US 2024/0244803 A1    Jul. 18, 2024

(51) Int. Cl.
| | |
|---|---|
| *H05K 7/20* | (2006.01) |
| *B60L 53/16* | (2019.01) |
| *B60L 53/302* | (2019.01) |
| *H01R 27/00* | (2006.01) |

(52) U.S. Cl.
CPC .......... *H05K 7/20872* (2013.01); *B60L 53/16* (2019.02); *B60L 53/302* (2019.02); *H01R 27/00* (2013.01); *H05K 7/20254* (2013.01); *H05K 7/20281* (2013.01); *B60L 2210/10* (2013.01); *B60L 2210/30* (2013.01); *H01R 2201/26* (2013.01)

(58) Field of Classification Search
CPC .......... H05K 7/20845; H05K 7/20872; H05K 7/20218; H05K 7/20254; H05K 7/20854; H05K 7/2089; H05K 7/209; H05K 7/20927; B60L 53/16; B60L 53/22; H01R 9/11; H01R 2201/26
See application file for complete search history.

(56) References Cited

U.S. PATENT DOCUMENTS

| | | | | |
|---|---|---|---|---|
| 9,145,058 B2 * | 9/2015 | Suzuki | ..................... | B60K 1/00 |
| 10,377,264 B2 * | 8/2019 | Lopez | ..................... | B60L 53/16 |
| 11,277,936 B2 * | 3/2022 | Wu | ..................... | H05K 7/20136 |
| 11,387,598 B2 * | 7/2022 | Durse | ................... | B60L 53/302 |
| 11,469,531 B2 * | 10/2022 | Cole | ....................... | B60L 53/11 |
| 2024/0017618 A1 * | 1/2024 | Teraoka | ............. | H05K 7/20854 |

OTHER PUBLICATIONS

"Combined Charging System," Wikipedia Website, Available Online at https://en.wikipedia.org/wiki/Combined_Charging_System, Page Created Apr. 3, 2014, 9 pages.

Shepard, J., "Use CCS Connectors to Simplify the Implementation of Safe EV Fast Charging Systems," Digi-Key Website, Available Online at https://www.digikey.com/en/articles/use-ccs-connectors-to-simplify-the-implementation-of-safe-ev-fast-charging-systems, Mar. 23, 2022, 9 pages.

"AMP+ Charging Inlets, Type 2, AC & CCS (Combined Charging System)," TE Connectivity Website, Available Online at https://www.te.com/usa-en/products/connectors/automotive-connectors/intersection/amp-plus-charging-inlets/charging-inlet-type-2.html?tab=pgp-story, Retrieved on Apr. 12, 2023, 8 pages.

* cited by examiner

*Primary Examiner* — Jayprakash N Gandhi
*Assistant Examiner* — Steven Ngo
(74) *Attorney, Agent, or Firm* — McCoy Russell LLP

(57) ABSTRACT

Methods and systems are provided for controlling a temperature of a vehicle power input port that is configured to receive power for a traction battery. In one example, a liquid cooled cold plate is configured to extract heat from the vehicle power input port so that there may be a reduced possibility of limiting electric power flow to the vehicle during charging of a traction battery.

16 Claims, 5 Drawing Sheets

VEHICLE CHARGING SYSTEM AND METHOD, WITH POWER CONVERTERS DIRECTLY COUPLED TO LIQUID COOLED COLD PLATE

FIELD

The present description relates generally to methods and systems for charging an electric vehicle. The methods and systems may be particularly useful for vehicles that use fast charging stations.

BACKGROUND/SUMMARY

An electric vehicle may be recharged at different charging levels. In particular, some electric vehicles may be charged via level one, level two, or a level three traction battery charger. A level one traction battery charger may charge an electric vehicle using approximately 120 volts alternating current (VAC). A level two traction battery charger may charge an electric vehicle using approximately 240 VAC. A level three traction battery charger may charge an electric vehicle using >400 volts direct current (VDC). The level three chargers may rapidly increase charge stored in the traction battery, but the rate of increase in traction battery charge may be constrained because larger amounts of electric current flowing through conductors and connectors within the vehicle may tend to increase temperatures of the conductors and connectors within the vehicle. As such, the electric vehicle may not be able to utilize the full capacity of the level three charger.

The different traction battery charging systems may also present other challenges for the vehicle. In particular, the electric vehicle's traction battery is direct current (DC) and it has an operating voltage that may be different than that of the charger levels. Therefore, the vehicle may include an alternating current (AC) to DC (AC/DC) power converter and a DC/DC power converter. The AC/DC power converter may receive power input from a first power receptacle and the DC/DC power converter may receive power input from a second power receptacle. The power converters may be located at different ends of the vehicle (e.g., front end and rear end) due to packaging constraints or other objectives. Consequently, the vehicle may include long power lines that may influence electromagnetic compatibility when electric power is being supplied to the vehicle.

The inventors herein have recognized the above-mentioned issues and have developed a vehicle system, comprising: a vehicle traction battery charging port, the vehicle traction battery charging port configured to receive electric power for charging a traction battery, the vehicle traction battery charging port directly coupled to a liquid cooled cold plate.

By directly coupling a vehicle traction battery charging port to a liquid cooled cold plate, it may be possible to provide the technical result of reducing heat generated by flowing electric power through a connector that leads to a traction battery. Lowering the temperature of the connector may allow larger amounts of electric power to flow through the connector and to the traction battery so that output of the charging station may be constrained less than if the connector were not cooled. In addition, the connector may accommodate AC and DC input so that cable lengths may be reduced. Further still, the cold plate may also cool DC/DC and AC/DC power converters so that cooling of the electric power system may be accomplished with fewer connections to a cooling system.

The present description may provide several advantages. In particular, the approach may improve vehicle charging. Further, the approach may simplify designs for electric power cooling in a vehicle. Additionally, the approach may improve electromagnetic compatibility in vehicles.

It may be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 1:
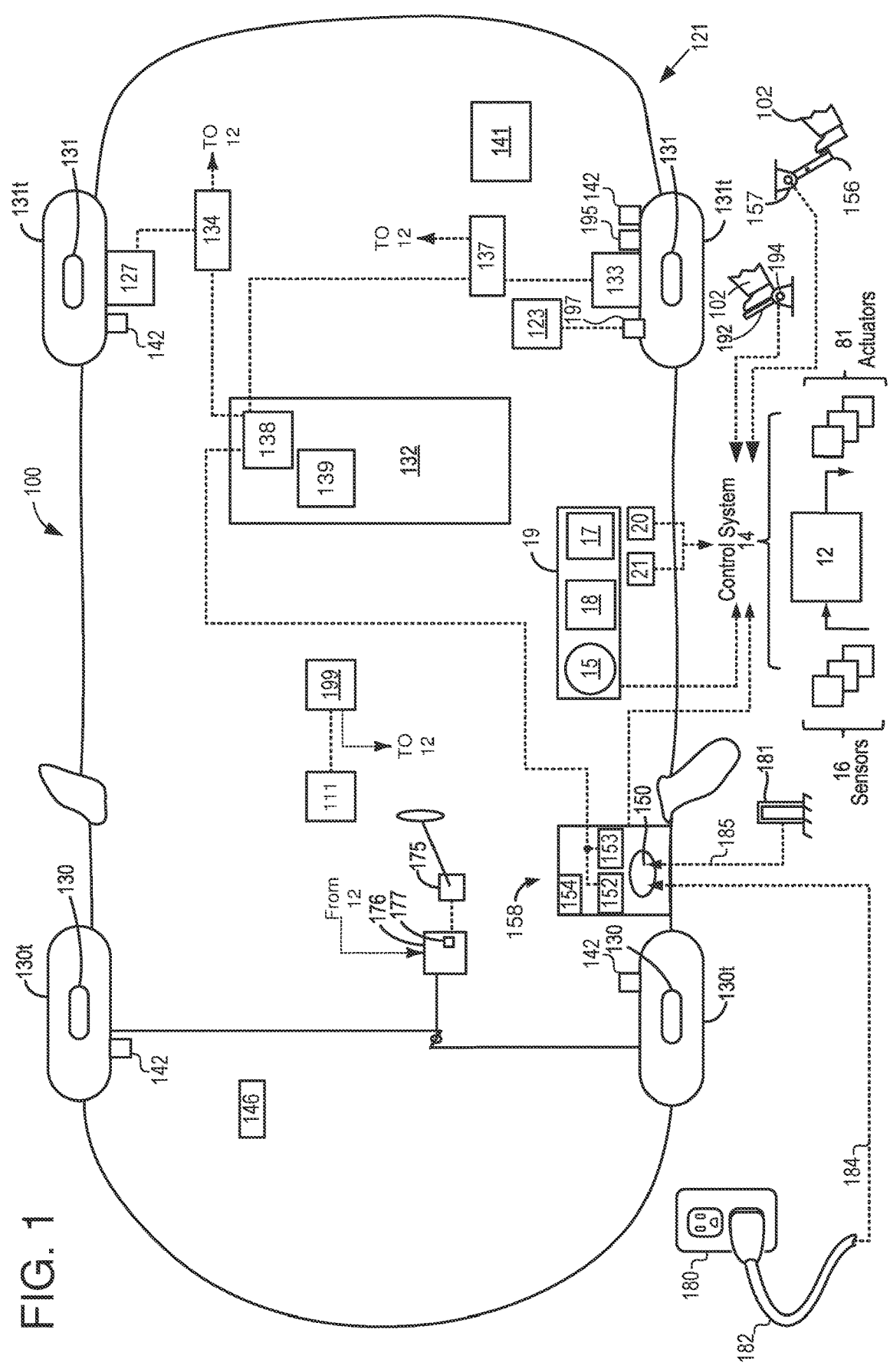
FIG. 1 is a schematic diagram of an example vehicle driveline and electric power system.
Figure 7:
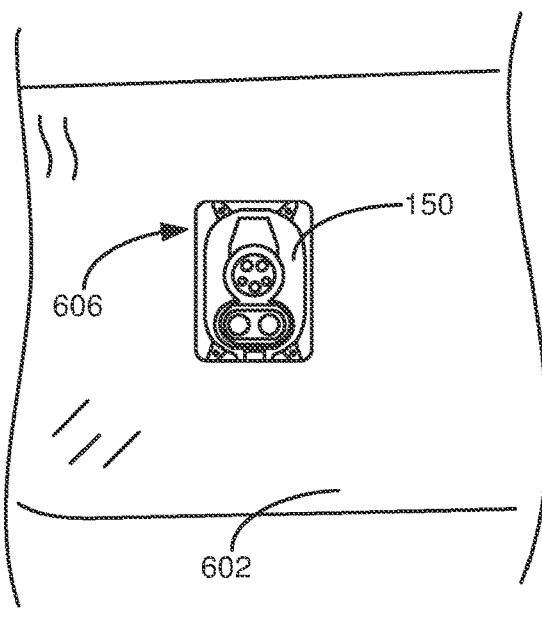
Figure 8:
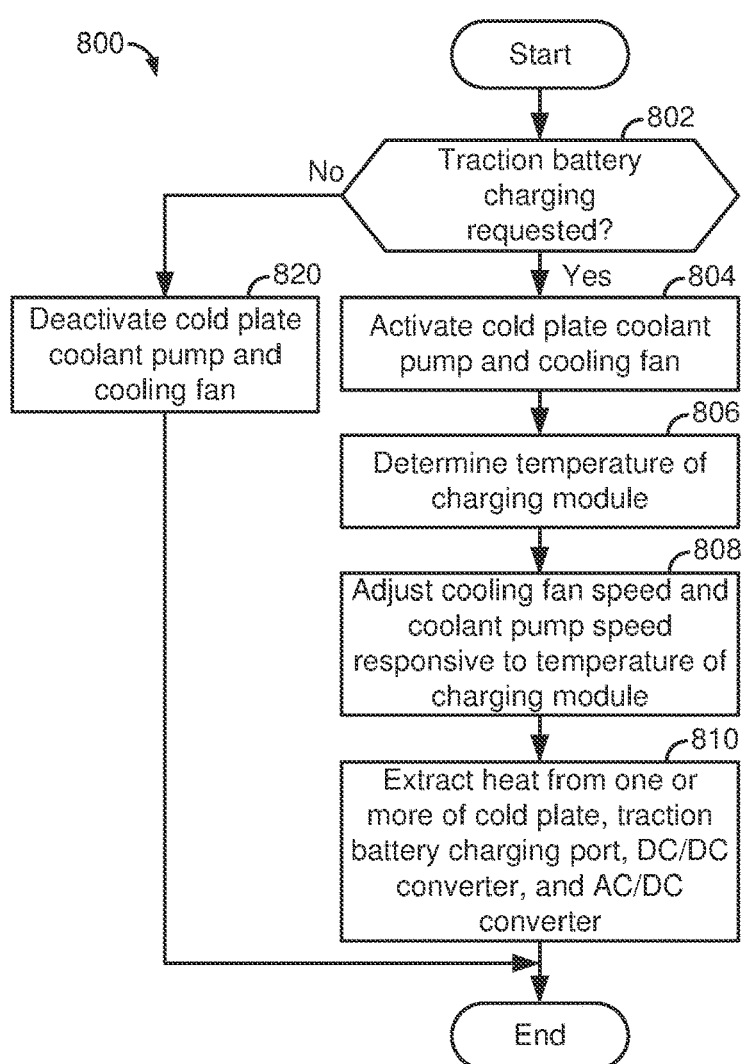
FIG. 8 is a flowchart of a method for a vehicle electric power system.
Figure 9:
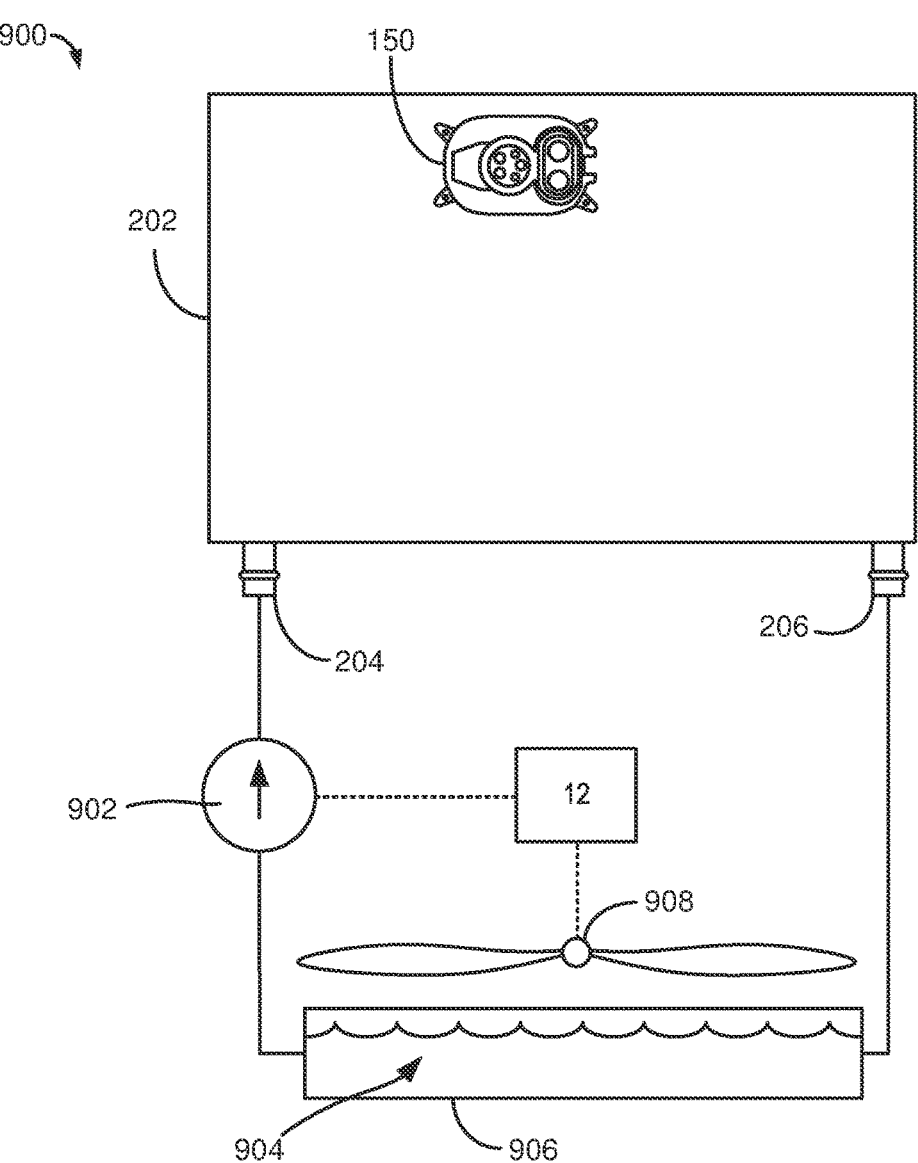
FIG. 9 is a schematic of an example cooling system for electric power components.

The following description relates to systems and methods for charging an electric vehicle. FIG. 1 shows a non-limiting example vehicle configuration in which a charging power port may be installed for recharging a depleted traction battery (e.g., a battery that supplies electric charge to an electric machine that provides propulsive effort for a vehicle). Example charging power port configurations and cold plates are shown in FIGS. 2-7. A method for charging an electric vehicle is shown in FIG. 8. Finally, a cooling system for a charging power port for a traction battery is shown in FIG. 9.

FIG. 1 illustrates an example vehicle propulsion system 100 for vehicle 121. In this example, vehicle propulsion system 100 includes two electric machines that may be applied to propel vehicle 121. Throughout the description of FIG. 1, mechanical connections between various components are illustrated as solid lines, whereas electrical connections between various components are illustrated as dashed lines.

In this example, vehicle propulsion system 100 includes a first electric machine 127 that is coupled to solely one wheel. Vehicle propulsion system 200 also includes a second electric machine 133 that is coupled solely to one wheel. In this example, the rear wheels are driven, but in other examples the front wheels may also be driven.

A first inverter system controller 134 may convert alternating current generated by electric machine 127 to direct current for storage at the electric energy storage device 132 and vice versa. A second inverter system controller 137 may convert alternating current generated by second electric machine 133 to direct current for storage at the electric energy storage device 132 and vice versa.

Electric machine 127 and electric machine 133 are controlled via controller 12. The controller 12 receives signals from the various sensors shown in FIGS. 1 and 2. In addition, controller 12 employs the actuators shown in FIG. 1 to adjust driveline operation based on the received signals and instructions stored in memory of controller 12. In some examples, the vehicle propulsion system 100 may include an internal combustion engine (not shown).

Vehicle propulsion system 100 includes front wheels 130 and rear wheels 131. In this example, one rear wheel is coupled to electric machine 127 and the other rear wheel is coupled to electric machine 133. Electric machines 127 and 133 may receive electrical power from onboard electrical energy storage device 132. Furthermore, electric machines 127 and 133 may provide a generator function to convert the vehicle's kinetic energy into electrical energy, where the electrical energy may be stored at electric energy storage device 132 for later use by the electric machine 127 and/or 133. A first inverter system controller (ISC1) 134 may convert alternating current generated by electric machine 127 to direct current for storage at the electric energy storage device 132 and vice versa. A second inverter system controller (ISC2) 137 may convert alternating current generated by electric machine 133 to direct current for storage at the electric energy storage device 132 and vice versa. Electric energy storage device 132 may be referred to as a traction battery since it may supply electric charge to electric machines (e.g., 127 and 133) that provide propulsive effort to vehicle 121.

In some examples, electric energy storage device 132 may be configured to store electrical energy that may be supplied to other electrical loads residing on-board the vehicle (other than the motor), including cabin heating and air conditioning, engine starting, headlights, cabin audio and video systems, etc.

Control system 14 may communicate with one or more of electric machine 127, energy storage device 132, electric machine 133, etc. Control system 14 may receive sensory feedback information from one or more of electric machine 133, electric machine 127, energy storage device 132, etc. Further, control system 14 may send control signals to one or more of electric machine 133, electric machine 127, energy storage device 132, etc., responsive to this sensory feedback. Control system 14 may receive an indication of an operator requested output of the vehicle propulsion system from a human operator 102, or an autonomous controller. For example, control system 14 may receive sensory feedback from driver demand pedal position sensor 194 which communicates with driver demand pedal 192. Similarly, control system 14 may receive an indication of an operator requested vehicle braking via a human operator 102, or an autonomous controller. For example, control system 14 may receive sensory feedback from brake pedal position sensor 157 which communicates with brake pedal 156.

Energy storage device 132 may periodically receive electrical energy from an alternating current (AC) power source 180 (e.g., a stationary power grid) or a direct current power source 181 residing external to the vehicle (e.g., not part of the vehicle) as indicated by arrows 184 and 185. As a non-limiting example, vehicle propulsion system 100 may be configured as a plug-in electric vehicle, whereby electrical energy may be supplied to energy storage device 132 from power source 180 via an electrical energy transmission cable 182.

AC or DC power may be received via a traction battery charging port 150. The traction battery charging port 150 may include separate terminals or connections for AC and DC power. In the present example, traction battery charging port 150 may be part of a vehicle charging module 158. Vehicle charging module 158 may include a liquid cooled cold plate (not shown), an AC/DC converter 152, a DC/DC converter 153, and power management and communication circuitry 154. AC/DC converter 152 converts AC power at a first voltage to DC power at a second voltage that is appropriate for charging traction battery 132. DC/DC converter 153 converts DC power at a first DC voltage to DC power at a second DC voltage that is appropriate for charging traction battery 132. Power management and communications circuitry 154 may allow controller 12 to communicate with AC power source 180 and DC power source 181, exchange payment information, and request a lower power output from AC power source 180 and DC power source 181.

While the vehicle propulsion system is operated to propel the vehicle, electrical energy transmission cables may be disconnected from AC power source 180 and DC power source 181. Control system 14 may identify and/or control the amount of electrical charge stored at the energy storage device 132, which may be referred to as the state of charge (SOC).

Electric energy storage device 132 includes an electric energy storage device controller 139. Electric energy storage device controller 139 may provide charge balancing between energy storage element (e.g., battery cells) and communication with other vehicle controllers (e.g., controller 12).

Vehicle propulsion system 100 may also include inertial sensors 199. Inertial sensors 199 may comprise one or more of the following: longitudinal, latitudinal, vertical, yaw, roll, and pitch sensors (e.g., accelerometers). Axes of yaw, pitch, roll, lateral acceleration, and longitudinal acceleration are as indicated. The control system may adjust electric machine output and/or the torque vectoring electric machines to increase vehicle stability in response to sensor(s) 199. In another example, the control system may adjust an active suspension system 111 responsive to input from inertial sensors 199. Active suspension system 111 may comprise an active suspension system having hydraulic, electrical, and/or mechanical devices, as well as active suspension systems that control the vehicle height on an individual corner basis (e.g., four corner independently controlled vehicle heights), on an axle-by-axle basis (e.g., front axle and rear axle vehicle heights), or a single vehicle height for the entire vehicle. Data from inertial sensor 199 may also be communicated to controller 12, or alternatively, sensors 199 may be electrically coupled to controller 12.

One or more tire pressure monitoring sensors (TPMS) may be coupled to one or more tires (e.g., 130*t* and 131*t*) of wheels (e.g., 130 and 131) in the vehicle. For example, FIG. 1 shows a tire pressure sensor 197 coupled to wheel 131 and configured to monitor a pressure in a tire 131*t* of wheel 131. While not explicitly illustrated, it may be understood that each of the four tires indicated in FIG. 1 may include one or more tire pressure sensor(s) 197. Furthermore, in some examples, vehicle propulsion system 100 may include a pneumatic control unit 123. Pneumatic control unit may receive information regarding tire pressure from tire pressure sensor(s) 197, and send said tire pressure information to control system 14. Based on said tire pressure information, control system 14 may command pneumatic control unit 123 to inflate or deflate tire(s) of the vehicle wheels. While not explicitly illustrated, it may be understood that pneumatic control unit 123 may be used to inflate or deflate tires associated with any of the four wheels illustrated in FIG. 1. For example, responsive to an indication of a tire pressure decrease, control system 14 may command pneumatic control system unit 123 to inflate one or more tire(s). Alternatively, responsive to an indication of a tire pressure increase, control system 14 may command pneumatic control system unit 123 to deflate tire(s) one or more tires. In both examples, pneumatic control system unit 123 may be used to inflate or deflate tires to an optimal tire pressure rating for said tires, which may prolong tire life.

One or more wheel speed sensors (WSS) 195 may be coupled to one or more wheels of vehicle propulsion system 100. The wheel speed sensors may detect rotational speed of each wheel. Such an example of a WSS may include a permanent magnet type of sensor.

Vehicle propulsion system 100 may further include an accelerometer 20. Additionally, vehicle propulsion system 100 may further include an inclinometer 21. Vehicle propulsion system 100 may also include a steering control system 176 that may adjust a steering angle via adjusting a position of steering motor 177.

Vehicle propulsion system 100 may further include a brake system control module (BSCM) 141 to apply and release friction wheel brakes 142. In some examples, BSCM 141 may comprise an anti-lock braking system, such that tires (e.g., 130$t$ and 1311) of wheels (e.g. 130, 131) may maintain tractive contact with the road surface according to driver inputs while braking, which may thus prevent the wheels from locking up, to prevent skidding.

Vehicle propulsion system 100 may further include a motor electronics coolant pump (MECP) 146. MECP 146 may be used to circulate coolant to diffuse heat generated by at least electric machine 127 and electric machine 133 of vehicle propulsion system 100, and the electronics system. MECP may receive electrical power from onboard energy storage device 132, as an example.

Controller 12 may comprise a portion of a control system 14. In some examples, controller 12 may be a single controller of the vehicle. Control system 14 is shown receiving information from a plurality of sensors 16 (various examples of which are described herein) and sending control signals to a plurality of actuators 81 (various examples of which are described herein). As one example, sensors 16 may include tire pressure sensor(s) 197, wheel speed sensor(s) 195, inertial sensors 199, etc. In some examples, steering angle sensor 175, sensors associated with electric machine 133 and electric machine 127, etc., may communicate information to controller 12, regarding various states of electric machine operation.

Vehicle propulsion system 100 may also include an onboard navigation system 17 (for example, a Global Positioning System) on dashboard 19 that an operator of the vehicle may interact with. The navigation system 17 may include one or more location sensors for assisting in estimating a location (e.g., geographical coordinates) of the vehicle. For example, on-board navigation system 17 may receive signals from GPS satellites (not shown), and from the signal identify the geographical location of the vehicle. In some examples, the geographical location coordinates may be communicated to controller 12.

Dashboard 19 may further include a display system 18 configured to display information to the vehicle operator. Display system 18 may comprise, as a non-limiting example, a touchscreen, or human machine interface (HMI), display which enables the vehicle operator to view graphical information as well as input commands. In some examples, display system 18 may be connected wirelessly to the internet (not shown) via controller (e.g. 12). As such, in some examples, the vehicle operator may communicate via display system 18 with an internet site or software application (app).

Dashboard 19 may further include an operator interface 15 via which the vehicle operator may adjust the operating status of the vehicle. Specifically, the operator interface 15 may be configured to initiate and/or terminate operation of the vehicle driveline (e.g., electric machine 133 and electric machine 127) based on an operator input. Various examples of the operator interface 15 may include interfaces that apply a physical apparatus, such as an active key, that may be inserted into the operator interface 15 to activate electric machines 133 and 127, or may be removed to shut down the electric machines 133 and 127 to turn off the vehicle. Other examples may include a passive key that is communicatively coupled to the operator interface 15. The passive key may be configured as an electronic key fob or a smart key that does not have to be inserted or removed from the operator interface 15 to operate the electric machines 133 and 127. Rather, the passive key may need to be located inside or proximate to the vehicle (e.g., within a threshold distance of the vehicle).

Figures 2, 3:
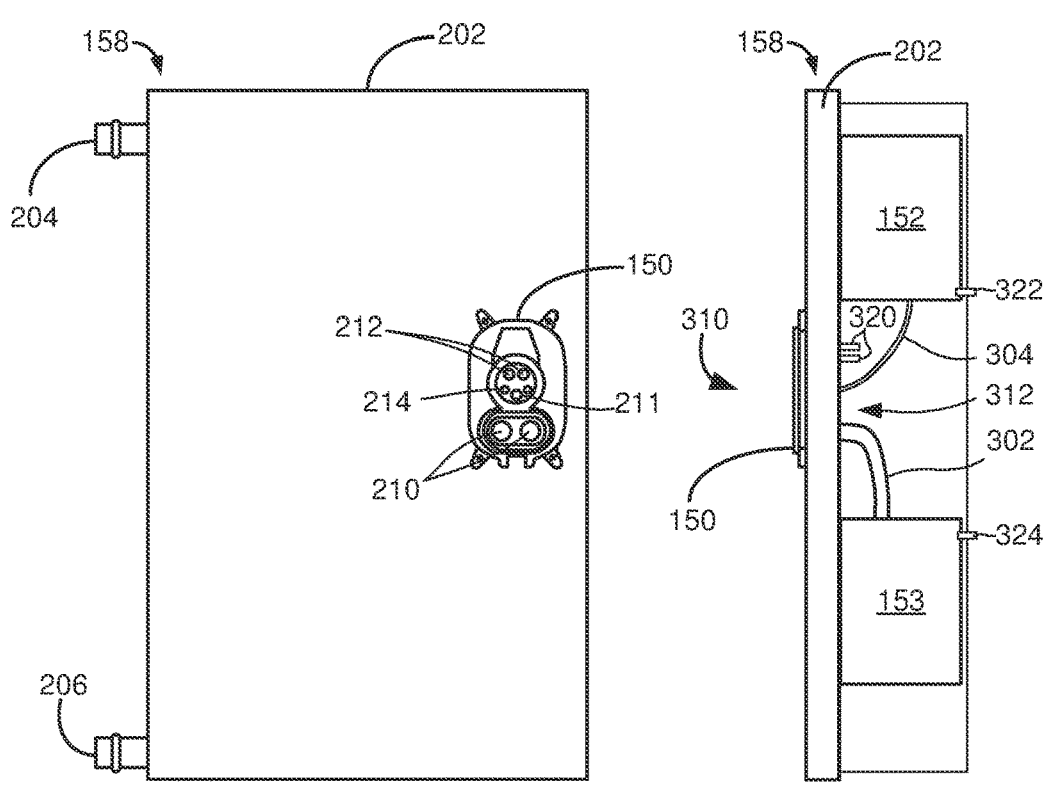
FIGS. 2-7 show example charging port configurations.

Referring now to FIG. 2, a plan view of one side of a first example of vehicle charging module 158 is shown. First vehicle charging module 158 includes a liquid coolant inlet port 204 and a liquid coolant outlet port 206. The liquid coolant extracts and transfers heat from cold plate 202 to lower temperatures of devices that include traction battery charging port 150. Traction battery charging port 150 is directly mechanically coupled to cold plate 202 such that traction battery charging port 150 is in direct thermal communication with cold plate 202. Traction battery charging port 150 includes DC terminals or connectors 210 for receiving charge from a DC charger. Connectors 210 may be described as a sub-charging port of traction battery charging port 150 that are configured to receive charge from a level three charger. Traction battery charging port 150 also includes AC terminals or connectors 212 for receiving charge from an AC charger. Connectors 212 may be described as a sub-charging port of traction battery charging port 150 and they are configured to receive charge from a level two charger or a level one charger (e.g., 120V or 240V). Further, traction battery charging port 150 also includes communication terminals or connectors 214 for communicating with AC or DC chargers.

Turning now to FIG. 3, a side view of the first vehicle charging module 158 is shown. In this example, traction battery charging port 150 is a flow through design that allows electric power to be delivered from a front side 310 to a rear side 312 of the traction battery charging port 150 such that AC conductors 304 and DC conductors 302 transfer electric power through passages in first vehicle charging module 158 (not shown). AC conductors 304 and DC conductors 302 may be in direct thermal communication with cold plate 202. AC/DC converter 152 is shown directly mechanically coupled to cold plate 202 such that AC/DC converter 152 is in direct thermal communication with cold plate 202. Consequently, cold plate 202 may remove heat from AC/DC converter 152. Similarly, DC/DC converter 153 is shown directly mechanically coupled to cold plate 202 such that DC/DC converter 153 is in direct thermal communication with cold plate 202. Consequently, cold plate 202 may remove heat from DC/DC converter 153.

Temperature of connectors 210-212 may be determined via one or more temperature sensors 320. Similarly, a temperature of AC/DC converter 152 may be determined via temperature sensor 322 and a temperature of DC/DC converter 153 may be determined via temperature sensor 324.

Figures 4, 5:
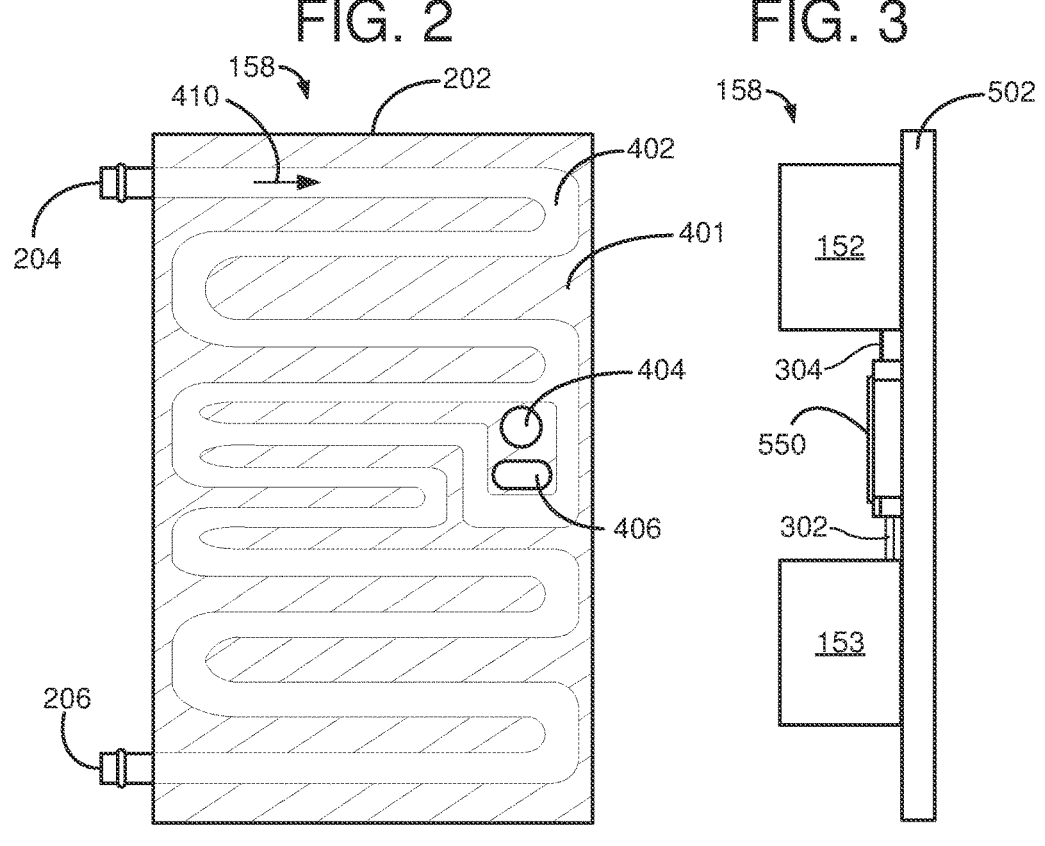

Referring now to FIG. 4, a cross-section of cold plate 202 for the first example of the vehicle charging module 158 is shown. The cross-section shows cooling passage 402 in which liquid coolant flows in the direction that is indicated by arrow 410. Solid material (e.g., metal) is indicated via hatched areas 401. Through holes 404 and 406 permit AC and DC conductors to pass through cold plate 202 and connect with traction battery charging port 150.

Moving on to FIG. 5, a side view of the second example of vehicle charging module 158 is shown. In this example, traction battery charging port 550 is not a flow through design. Rather, it distributes electric power in tangential directions via AC conductors 304 and DC conductors 302. AC conductors 304 and DC conductors 302 do not pass through second example cold plate 502. Similar to other versions of vehicle charging module 158, AC/DC converter 152 is shown directly mechanically coupled to second example cold plate 502 such that AC/DC converter 152 is in direct thermal communication with second example cold plate 502. Further, DC/DC converter 153 is shown directly mechanically coupled to second example cold plate 502 such that DC/DC converter 153 is in direct thermal communication with second example cold plate 502. In this example, second example cold plate 502 does not include through holes for AC and DC conductors.

Figure 6:
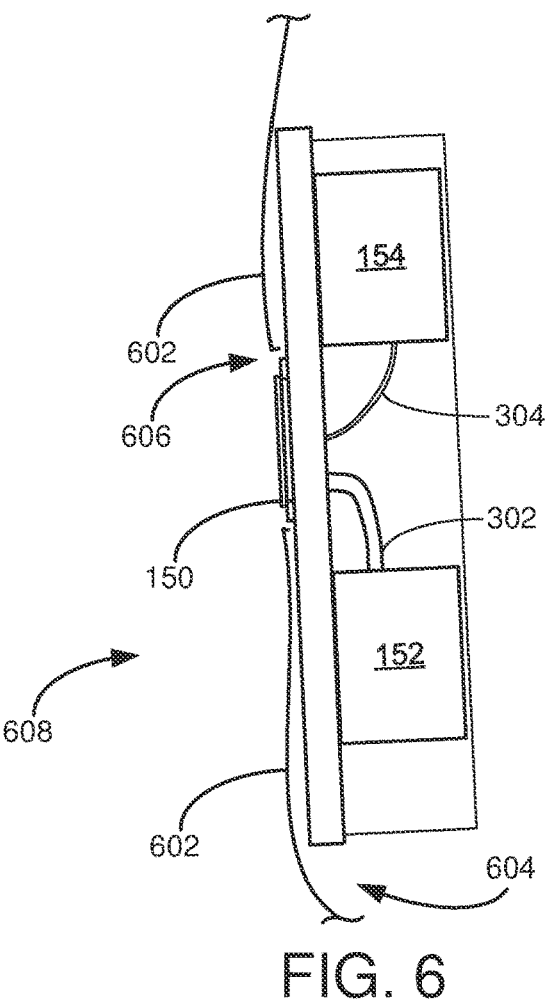

Referring now to FIG. 6, a side view of a mounting configuration for the first example of vehicle charging module 158 is shown. In this example, vehicle charging module 158 is positioned inside 604 of vehicle body panel 602. Vehicle body panel 602 includes a through hole 606 to allow a charging cable access to vehicle charging module 158. Vehicle charging module 158 may be fastened to a vehicle chassis (not shown) or other support mechanism. Outside 608 of vehicle body panel 602 may include an access door to cover and permit access to the first example of vehicle charging module 158. FIG. 7 shows a front view of vehicle charging module 158 positioned behind vehicle body panel 602. FIG. 7 also shows through hole 606 which allows access to traction battery charging port 150.

Referring now to FIG. 8, an example method for operating an electric vehicle is shown. The method of FIG. 8 may be incorporated into and may cooperate with the systems of FIGS. 1-7. Further, at least portions of the method of FIG. 8 may be incorporated as executable instructions stored in non-transitory memory while other portions of the method may be performed via a controller transforming operating states of devices and actuators in the physical world.

At 802, method 800 judges whether or not charging of a vehicle's traction battery is requested. Method 800 may judge that charging of a vehicle's traction battery is requested when one or more of the following conditions are present: an access door is open; a voltage is applied to connectors or terminals of a traction battery charging port; in response to user input; or other by other means. For example, if method 800 judges that 240 VAC is applied to AC input connectors of a traction battery charging port, the answer is yes and method 800 proceeds to 804. Otherwise, the answer is no and method 800 proceeds to 820.

At 820, method 800 deactivates the cold plate coolant pump (e.g., 902 of FIG. 9) and a cooling fan (e.g., 908 of FIG. 9). By deactivating the cooling fan and the cold plate coolant pump, energy may be conserved. Method 800 proceeds to exit.

At 804, method 800 activates the cold plate coolant pump (e.g., 902 of FIG. 9) and a cooling fan (e.g., 908 of FIG. 9). By activating the cooling fan and the cold plate coolant pump, the cold plate may transfer heat from one or more of an AC/DC converter, a DC/DC converter, and a traction battery charging port 150 to ambient air. Extracting heat from these components may allow the vehicle to receive greater amounts of charge in a shorter period of time. Method 800 proceeds to 806.

At 806, method 800 determines a temperature of a vehicle charging module (e.g., 158 of FIG. 1). The temperature may be a temperature of a terminal or connector or a temperature of a power converter (e.g., AC or DC). Method 800 proceeds to 808.

At 808, method 800 adjusts a coolant pump speed and a cooling fan speed according to the temperature that was determined at 806. In one example, method 800 may reference a table that contains empirically determined coolant pump speeds by the temperature. Method 800 adjusts the coolant pump speed according to output of the cooling pump speed table. Further, method 800 may reference a table that contains empirically determined cooling fan speeds by the temperature. Method 800 adjusts the coolant fan speed according to output of the cooling fan speed table. Method 800 adjusts the coolant pump speed according to output of the coolant pump speed table. Method 800 proceeds to 810.

At 810, method 800 flows coolant through the cold plate via activating the coolant pump. The cold plate may extract heat from one or more of a vehicle traction battery charge port, an AC/DC charger, and/or a DC/DC charger. Method 800 cools coolant that was heated in the cold plate via activating the cooling fan and rejecting heat to ambient air. Method 800 proceeds to exit.

In this way, heat may be extracted from a traction battery charging port so that the connectors of the traction battery charging port may support higher levels of current flow. Further, a cold plate may support more than one operation to lower system costs.

Thus, the method of FIG. 8 provides for a vehicle charging method, comprising: flowing a liquid coolant through a cold plate via a controller; and extracting and/or transferring heat from a traction battery charging port via the cold plate. In a first example, the vehicle charging method further comprises extracting heat from a DC/DC converter via the cold plate. In a second example that may include the first example, the vehicle charging method further comprises extracting heat from an AC/DC converter via the cold plate. In a third example that may include one or both of the first and second examples, the vehicle charging method further comprises adjusting a flow rate of the liquid coolant through the cold plate in response to a temperature of the traction battery traction battery charging port. In a fourth example that may include one or more of the first through third examples, the vehicle charging method includes where the liquid coolant flows through the cold plate when a traction battery is being charged. In a fifth example that may include one or more of the first through fourth examples, the vehicle charging method further comprises adjusting a fan speed in response to a temperature of the liquid coolant.

Referring now to FIG. 9, a schematic of a cooling system 900 for a vehicle charging system is shown. The cooling system 900 includes a cold plate 202 and cold plate 202 includes a liquid coolant inlet port 204 and a liquid coolant outlet port 206. Liquid coolant 904 may flow through cold plate 202 and heat exchanger 906. Liquid coolant pump 902 may be activated and deactivated via controller 12 to cool cold plate 202 and traction battery charging port 150. Cooling fan (e.g., an electric fan) may be activated and deactivated to flow air over heat exchanger 906, thereby cooling liquid coolant 904. Liquid coolant pump 902 may flow liquid coolant 904 through cold plate 202 to cool cold plate 202 and traction battery charging port 150. The heated coolant then flows to heat exchanger 906 so that heat may be removed from the liquid coolant 904.

The systems of FIGS. 1-7 and 9 provides for a vehicle system, comprising: a vehicle traction battery charging port, the vehicle traction battery charging port configured to receive electric power for charging a traction battery, the vehicle traction battery charging port directly coupled to a liquid cooled cold plate. In a first example, the vehicle system includes where the cold plate includes at least one through hole configured to permit an electric power lead to pass there through. In a second example that may include the first example, the vehicle system includes where the cold plate includes a coolant passage and two coolant ports. In a third example that may include one or both of the first and second examples, the vehicle system further comprises a vehicle body panel including a through hole configured to allow access to the vehicle traction battery charging port via a charging plug. In a fourth example that may include one or more of the first through third examples, the vehicle system includes where the vehicle traction battery charging port is configured to receive alternating current. In a fifth example that may include one or more of the first through fourth examples, the vehicle system includes where the alternating current is supplied at a first voltage. In a sixth example that may include one or more of the first through fifth examples, the vehicle system includes where vehicle traction battery charging port is configured with a plurality of sub-charging ports configured to receive a plurality of voltages. In a seventh example that may include one or more of the first through sixth examples, the vehicle system includes where the plurality of sub-charging ports support a level one charger. In an eighth example that may include one or more of the first through seventh examples, the vehicle system includes where the plurality of sub-charging ports support a level two charger.

The systems of FIGS. 1-7 and 9 also provides for a vehicle system, comprising: a liquid cooled cold plate; a first power converter, the first power converter directly coupled to the liquid cooled cold plate; and a vehicle traction battery charging port, the vehicle traction battery charging port configured to receive electric power for charging a traction battery, the vehicle traction battery charging port directly coupled to the liquid cooled cold plate. In a first example, the vehicle system includes where the first power converter is a direct current to direct current converter. In a second example that may include the first example, the vehicle system includes where the first power converter is an alternating current to direct current converter. In a third example that may include one or both of the first and second examples, the vehicle system further comprises a second power converter, the second power converter directly coupled to the liquid cooled cold plate. In a fourth example that may include one or more of the first through third examples, the vehicle system includes where the liquid cooled cold plate includes at least one through hole to accommodate at least one electrical conductor.

Note that the example control and estimation routines included herein can be used with various vehicle and powertrain configurations. The control methods and routines disclosed herein may be stored as executable instructions in non-transitory memory and may be carried out by the control system including the controller in combination with the various sensors, actuators, and other engine hardware.

Further, portions of the methods may be physical actions taken in the real world to change a state of a device. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example examples described herein, but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the engine control system, where the described actions are carried out by executing the instructions in a system including the various engine hardware components in combination with the electronic controller. One or more of the method steps described herein may be omitted if desired.

It will be appreciated that the configurations and routines disclosed herein are exemplary in nature, and that these specific examples are not to be considered in a limiting sense, because numerous variations are possible. For example, the above technology can be applied to induction electric machines and permanent magnet electric machines. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims may be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A vehicle system, comprising:
   a liquid cooled cold plate, where a front side of the liquid cooled cold plate is positioned towards the inside of a vehicle body panel and a rear side is opposite the front side, where the liquid cooled cold plate comprises an inlet port at a first distal end and an outlet port at a second distal end, where the vehicle traction battery charging port inlet port and outlet port are located on a first edge of the liquid cooled cold plate, and where a coolant passage weaves between the first edge of the liquid cooled cold plate and a second edge opposite the first edge;
   a vehicle traction battery charging port, the vehicle traction battery charging port configured to receive an electric power for charging a traction battery, where the vehicle traction battery charging port is directly coupled to the rear side of the liquid cooled cold plate and is arranged between the first distal end and the second distal end of the liquid cooled cold plate, where the vehicle traction battery charging port is arranged near the second edge of the liquid cooled cold plate, and where the coolant passage spans the distance between the first edge and second edge a greater number of times near the vehicle traction battery charging port than at the first distal end and the second distal end, and
   where the vehicle traction battery charging port is configured to receive an alternating current, and where an alternating current converter is arranged on the rear side of the liquid cooled cold plate;

where the vehicle traction battery charging port is configured to receive an direct current, and where an direct current converter is arranged on the rear side of the liquid cooled cold plate;

where the vehicle traction battery charging port is between the alternating current converter and direct current converter.

2. The vehicle system of claim 1, where the liquid cooled cold plate includes at least one through hole configured to permit an electric power lead to pass there through.

3. The vehicle system of claim 1, where the coolant passage wraps around through holes configured to permit AC and DC conductors to pass through the liquid cooled cold plate.

4. The vehicle system of claim 1, further comprising a vehicle body panel including a through hole configured to allow access to the vehicle traction battery charging port via a charging plug.

5. The vehicle system of claim 1, where the alternating current is supplied at a first voltage.

6. The vehicle system of claim 1, where the vehicle traction battery charging port is configured with a plurality of sub-charging ports configured to receive a plurality of voltages.

7. The vehicle system of claim 6, where the plurality of sub-charging ports support input from a level one charger.

8. The vehicle system of claim 7, where the plurality of sub-charging ports support input from a level two charger.

9. A vehicle charging method, comprising:

flowing a liquid coolant through a coolant passage in a liquid cooled cold plate, where the liquid cooled cold plate comprises an inlet port at a first distal end and an outlet port at a second distal end, where the inlet port and outlet port are located on a first edge of the liquid cooled cold plate, where the liquid coolant flows through a coolant passage that extends from the inlet port to the outlet port, where the coolant passage weaves between the first edge of liquid cooled cold plate and a second edge opposite the first edge, and where the liquid cooled cold plate has separate through holes for electrical leads via a controller; and extracting heat from a DC/DC converter via the cold plate, the DC/DC converter directly coupled to the rear side of the cold plate;

extracting heat from a AC/DC converter via the cold plate, the AC/DC converter directly coupled to the rear side of the cold plate;

extracting heat from a vehicle traction battery charging port via the cold plate, the vehicle traction battery charging port is between the AC/DC converter and DC/DC converter.

10. The vehicle charging method of claim 9, further comprising adjusting a flow rate of the liquid coolant through the cold plate in response to a temperature of the vehicle traction battery charging port.

11. The vehicle charging method of claim 9, where the liquid coolant flows through the cold plate when a traction battery is being charged.

12. The vehicle charging method of claim 9, further comprising adjusting a fan speed in response to a temperature of the liquid coolant.

13. A vehicle system, comprising:

a liquid cooled cold plate, where a front side of the liquid cooled cold plate is positioned toward the inside of the vehicle body panel and a rear side is opposite the front side;

a first power converter, the first power converter directly coupled to the rear side of the liquid cooled cold plate, where a first temperature sensor is coupled with the first power converter;

a second power converter, the second power converter directly coupled to the rear side of the liquid cooled cold plate, where a second temperature sensor is coupled with the second power converter; and a vehicle traction battery charging port, the vehicle traction battery charging port configured to receive an electric power for charging a traction battery, the vehicle traction battery charging port directly coupled to the rear side of the liquid cooled cold plate as the first power converter, where the vehicle traction battery charging port is between the first power converter and second power converter.

14. The vehicle system of claim 13, where the first power converter is a direct current to direct current converter.

15. The vehicle system of claim 13, where the first power converter is an alternating current to direct current converter.

16. The vehicle system of claim 13, where conductors for the first power converter do not pass through the liquid cooled cold plate.

* * * * *